(12) United States Patent
Tu

(10) Patent No.: US 7,595,748 B2
(45) Date of Patent: Sep. 29, 2009

(54) METHOD OF GAIN ERROR CALIBRATION IN A PIPELINED ANALOG-TO-DIGITAL CONVERTER OR A CYCLIC ANALOG-TO-DIGITAL CONVERTER

(75) Inventor: Yu-Hsuan Tu, Tainan (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/117,833

(22) Filed: May 9, 2008

(65) Prior Publication Data

US 2009/0027245 A1 Jan. 29, 2009

Related U.S. Application Data

(60) Provisional application No. 60/951,255, filed on Jul. 23, 2007.

(51) Int. Cl.
*H03M 1/06* (2006.01)

(52) U.S. Cl. .................. 341/188; 341/161; 341/163

(58) Field of Classification Search ............... 341/155, 341/144, 118, 120, 161, 163
See application file for complete search history.

(56) References Cited

U.S. PATENT DOCUMENTS 5,465,092 A * 11/1995 Mayes et al. .............. 341/118

6,825,783 B2 * 11/2004 You ........................... 341/118
6,900,749 B2 * 5/2005 Tani et al. .................. 341/118
2007/0285298 A1 * 12/2007 Easwaran et al. ........... 341/155

* cited by examiner

*Primary Examiner*—Peguy JeanPierre
(74) *Attorney, Agent, or Firm*—Thomas, Kayden, Horstemeyer & Risley

(57) ABSTRACT

The invention provides a method of gain error calibration in a pipelined analog-to-digital converter (ADC). In one embodiment, a first stage and a second stage of the pipelined ADC share a common operational amplifier. The first stage is requested to generate the stage output signal thereof according to a first correction number. The second stage is also requested to generate the stage output signal thereof according to a second correction number. A plurality of stage output values generated by stages of the pipelined ADC are collected. The stage output values are respectively correlated with the first correction number and the second correction number to estimate a first gain error estimate of the first stage and a second gain error estimate of the second stage. The first gain error estimate and the second gain error estimate are weighted to obtain a predicted gain error for gain error calibration in the first stage and the second stage.

13 Claims, 7 Drawing Sheets

METHOD OF GAIN ERROR CALIBRATION IN A PIPELINED ANALOG-TO-DIGITAL CONVERTER OR A CYCLIC ANALOG-TO-DIGITAL CONVERTER

CROSS REFERENCE TO RELATED APPLICATIONS

This application claims the benefit of U.S. Provisional Application No. 60/951,255, filed on Jul. 23, 2007.

BACKGROUND OF THE INVENTION

1. Field of the Invention

The invention relates to analog-to-digital converters (ADC), and more particularly to gain error calibration of ADCs.

2. Description of the Related Art

An analog-to-digital converter converts an analog input signal to a digital output signal. Analog-to-digital converters are classified into several categories including flash ADCs, pipelined ADCs, and cyclic ADCs. Among the three ADC categories, a flash ADC has the shortest latency, because it has the simplest circuit structure. A flash ADC comprises multiple comparators directly comparing an analog input signal with multiple reference voltages to generate a digital output signal. When the required resolution of a digital output signal increases, a flash ADC must include a great number of comparators, increasing circuit complexity and chip area thereof. Thus, a flash ADC is only used when resolution of the digital output signal is low.

Compared with a flash ADC, a pipelined ADC and a cyclic ADC require fewer comparators and occupy less chip area to generate a high resolution digital output signal. FIG. 1 is a block diagram of a conventional pipelined ADC 100. The pipelined ADC 100 comprises a plurality of stages 101~10N connected in series, with each stage generating a few bits of the digital output signal $D_{out}$. In the series, a preceding stage generates a stage output value indicating more significant bits of the digital output signal $D_{out}$, and a subsequent stage generates its stage output value indicating less significant bits of the digital output signal $D_{out}$. For example, the first stage 101 generates a stage output value $d_{o1}$ indicating the most significant bits, and the second stage 102, a subsequent stage of the first stage 101, generates a stage output value $d_{o2}$ indicating less significant bits. If the ADC 100 comprises N stages 101~10N, the stages 101~10N sequentially generate stage output values $d_{o0}, d_{o2}, \ldots, d_{oN}$, and the gain error correction module 120 then collects the stage output values $d_{o0}, d_{o2} \ldots, d_{oN}$ to generate the digital output signal $D_{out}$. Because each stage only generates a few bits of the digital output signal $D_{out}$, the signal resolution of the stage output value is lower and each stage requires fewer comparators to operate.

After a preceding stage generates a stage output value thereof, the preceding stage subtracts the stage output value from its stage input signal to obtain a residual signal, and amplifies the residual signal according to a predetermined gain value to obtain a stage output signal as the stage input signal of a subsequent stage. For example, the stage output signal $R_1$ of the first stage 101 is the stage input signal of the second stage 102, and the stage output signal $R_2$ of the second stage 102 is the stage input signal of the third stage 103. However, the actual gain value of each stage often deviates from the predetermined gain value due to chip fabrication errors or rise in chip temperature. The difference between the actual gain value of a stage and the predetermined gain value is referred to as a gain error of a stage. A gain error makes a preceding stage generate a mis-amplified stage output signal, causing errors in the stage output values of all subsequent stages in the series. Thus, the gain error of a stage must be estimated to ensure accuracy of the digital output signal $D_{out}$.

FIG. 2 shows a conventional process for estimating a gain error of a first stage 201 of a pipelined ADC 200. To estimate the gain error deviating from the predetermined gain value of the first stage 201, a gain error correction module 220 first generates a correction number $P_1$. The first stage 201 then processes the residual signal with the correction number $P_1$ before the residual signal is amplified. FIG. 3 is a block diagram of the first stage 201 of the pipelined ADC 200 of FIG. 2. After the first stage 201 generates a stage output value $d_{o1}$, the first stage 201 subtracts both the stage output value $d_{o1}$ and the correction number $P_1$ from the stage input signal $V_{in}$ to generate a residual signal Z. An amplifier 312 of the first stage 201 then amplifies the residual signal Z to generate the stage output signal $R_1'$. Because the residual signal Z is affected by the correction number $P_1$, if the amplifier 312 has a gain error $\epsilon$, the stage output signal $R_1'$ is affected by both the correction number $P_1$ and the gain error $\epsilon$. Thus, the stage output values $d_{o2}', d_{o3}' \ldots, d_{oN}'$ of all of the subsequent stages 202, 203, . . . , 20N are affected by both the correction number $P_1$ and the gain error $\epsilon$, and the gain error correction module 220 can determine the gain error $\epsilon$ by correlating the correction number $P_1$ and the stage output values $d_{o2}', d_{o3}', \ldots d_{oN}'$.

Two stages of a pipelined ADC can share a common operational amplifier to amplify the residual signals thereof. Additionally, because a plurality of stages of a cyclic ADC share a common physical circuit, the stages of a cyclic ADC also use a common operational amplifier to amplify the residual signals thereof. When multiple stages of a ADC share a common operational amplifier, because the operational amplifier has only one actual gain value, the gain error of the multiple stages are the same and require only one estimate. Thus, if the first stage 201 and the second stage 202 share a common operational amplifier to amplify the residual signals thereof, the gain error correction module 220 generates only one correction number $P_1$ to estimate the gain error of either the first stage 201 or the second stage 202. After the gain error estimate is obtained, the gain values of the first stage 201 and the second stage 202 are calibrated according to the same gain error estimate.

FIG. 4 shows a conventional process for estimating a gain error of a cyclic stage 414 of a cyclic ADC 400. Because N stages of the cyclic ADC 400 share a common physical circuit, the cyclic stage 414, the gain error correction module 420 needs to estimate only one gain error of the cyclic stage 414. The cyclic stage 414 first receives an analog input voltage $V_{in}$ as the stage input signal I and generates a stage output value do, and a stage output signal R according to the analog input voltage $V_{in}$ and a correction number $P_1$ generated by the gain error correction module 420. The stage output signal R is then recursively fed back as the stage input signal I, and the cyclic stage 414 sequentially generates stage output values $d_{o2}', d_{o3}', \ldots d_{oN}'$. A multiplexer 412 selects the analog input voltage $V_{in}$ or the stage output signal R as the stage input signal of the cyclic stage 414 according to a clock signal. The gain error correction module 420 then determines a gain error $\epsilon$ by correlating the correction number $P_1$ and the stage output values $d_{o2}', d_{o3}', \ldots d_{oN}'$. After the gain error $\epsilon$ is obtained, the gain values of all N stages of the cyclic ADC 400 are calibrated according to the same gain error $\epsilon$.

The gain error correction modules 220 in FIG. 2 must collect a great number of samples of the stage output values $d_{o2}'\sim d_{oN}'$ to estimate the gain error $\epsilon$ of the first stage 201 and the second stage 202. Accordingly, the gain error correction modules 420 in FIG. 4 must collect a great number of samples of the stage output values $d_{o2}'\sim d_{oN}'$ to estimate the gain error $\epsilon$ of the cyclic stage 414. The precision of the gain error estimate increases with the number of collected samples. If the number of collected samples is reduced, a low precision gain error estimate results. If the number of the collected samples is increased, the time required for collecting samples causes latency in gain error estimation. Thus, when multiple ADC stages share a common operational amplifier, a method for reducing time required for estimating a gain error of the multiple ADC stages without reducing precision of the gain error is desirable.

BRIEF SUMMARY OF THE INVENTION

The invention provides a method of gain error calibration in a pipelined analog-to-digital converter (ADC). In one embodiment, the pipelined ADC comprises a plurality of stages connected in series, each of the stages generates a stage output signal as a stage input signal of a subsequent stage of the series, and a first stage and a second stage selected from the stages generates the stage output signals thereof with a common operational amplifier. The first stage is requested to generate the stage output signal thereof according to both a first correction number and the stage input signal thereof. The second stage is also requested to generate the stage output signal thereof according to both a second correction number and the stage input signal thereof. A plurality of stage output values respectively generated by the stages are collected. The stage output values are correlated with the first correction number to estimate a first gain error estimate of the first stage. The stage output values are also correlated with the second correction number to estimate a second gain error estimate of the second stage. The first gain error estimate and the second gain error estimate are weighted to obtain a predicted gain error for gain error calibration in the first stage and the second stage.

The invention also provides a method of gain error calibration in a cyclic analog-to-digital converter (ADC). In one embodiment, the cyclic ADC comprises a plurality of stages connected in series, each of the stages derive a stage output value thereof from a stage input signal thereof and generates a stage output signal thereof as a stage input signal of a subsequent stage in the series, and the stages share a common physical circuit in a time division multiplexing way. First, a plurality of correction numbers are generated. The stages are then requested to generate the stage output signals thereof according to both, one of the correction numbers and the stage input signals thereof. The stage output values generated by the stages are then collected. The stage output values are then correlated with the correction numbers to calculate a plurality of gain error estimates of the stages. Finally, the gain error estimates are weighted to obtain a predicted gain error for gain error calibration of the stages.

The invention also provides a pipelined analog-to-digital converter (ADC). The pipelined ADC comprises a plurality of stages connected in series and a gain error correction module. Each of the stages generates a stage output signal as a stage input signal of a subsequent stage of the series and periodically derives a stage output value from the stage input signal thereof, wherein a first stage and a second stage selected from the stages generates the stage output signals thereof with a common operational amplifier. The gain error correction module generates a first correction number to affect generation of the stage output signal of the first stage, generates a second correction number to affect generation of the stage output signal of the second stage, collects the stage output values generated by the stages, correlates the stage output values with the first correction number to estimate a first gain error estimate of the first stage, correlates the stage output values with the second correction number to estimate a second gain error estimate of the second stage, and weights the first gain error estimate and the second gain error estimate to obtain a predicted gain error for gain error calibration in the first stage and the second stage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 5:
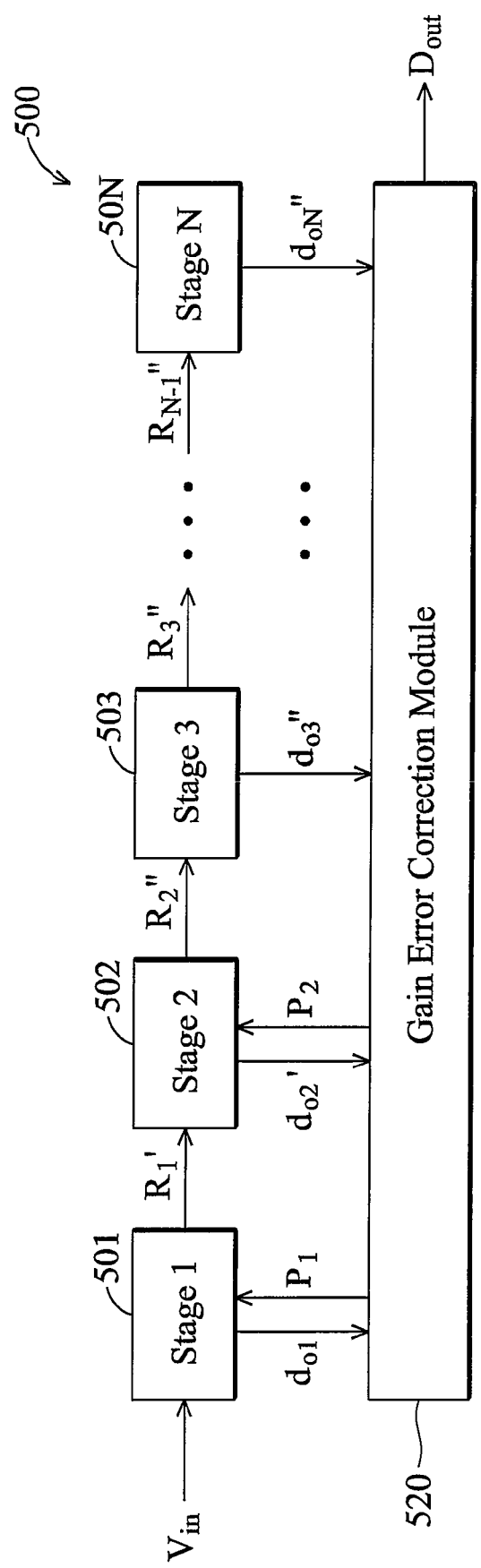
FIG. 5 shows a process for estimating a gain error of a first stage and a second stage of a pipelined ADC according to the invention, wherein the first stage and a second stage share a common operational amplifier.

FIG. 5 shows a process for estimating a gain error of a first stage 501 and a second stage 502 of a pipelined ADC 500 according to the invention, wherein the first stage 501 and a second stage 502 share a common operational amplifier. The first stage 501 and a second stage 502 use the common amplifier to generate the stage output signals $R_1'$ and $R_2''$. Although the first stage 501 and the second stage 502 have the same gain error, a gain error correction module 520 still respectively calculates a gain error estimate $\epsilon_1$ of the first stage 501 and a gain error estimate $\epsilon_2$ of the second stage 502. The gain error correction module 520 then weights the gain error estimates $\epsilon_1$ and $\epsilon_2$ to obtain a predicted gain error $\epsilon_A$. Finally, the gain values of the first stage 501 and the second stage 502 sharing the common operational amplifier are calibrated according to the predicted gain error $\epsilon_A$.

Figure 1:
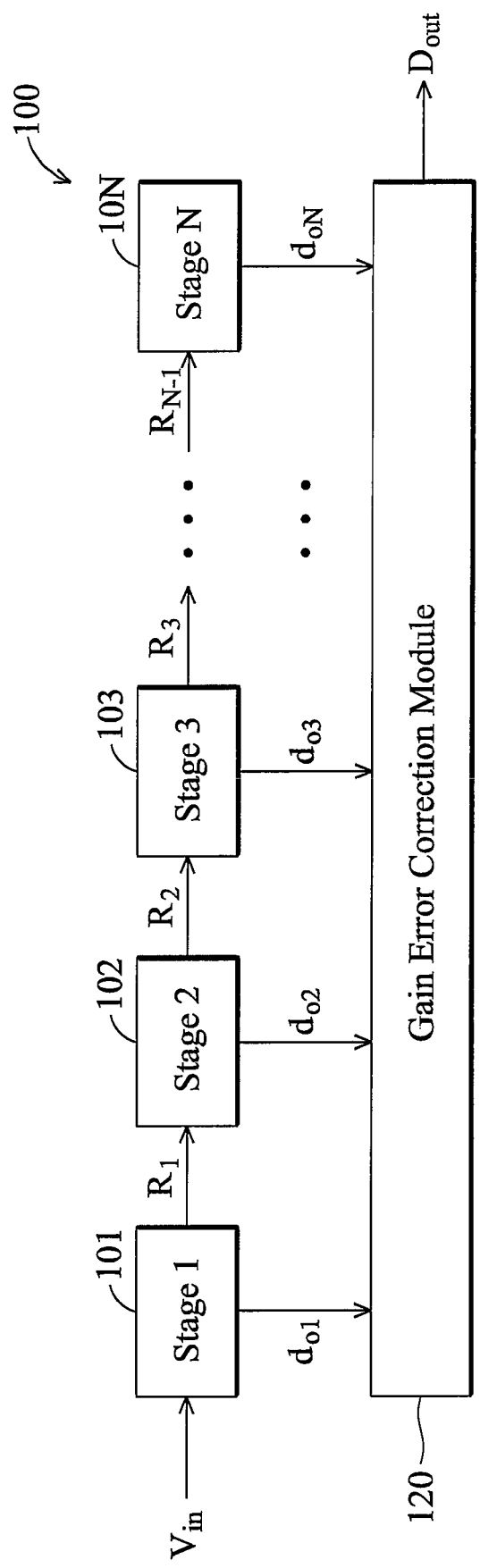
FIG. 1 is a block diagram of a conventional pipelined ADC.
Figure 2:
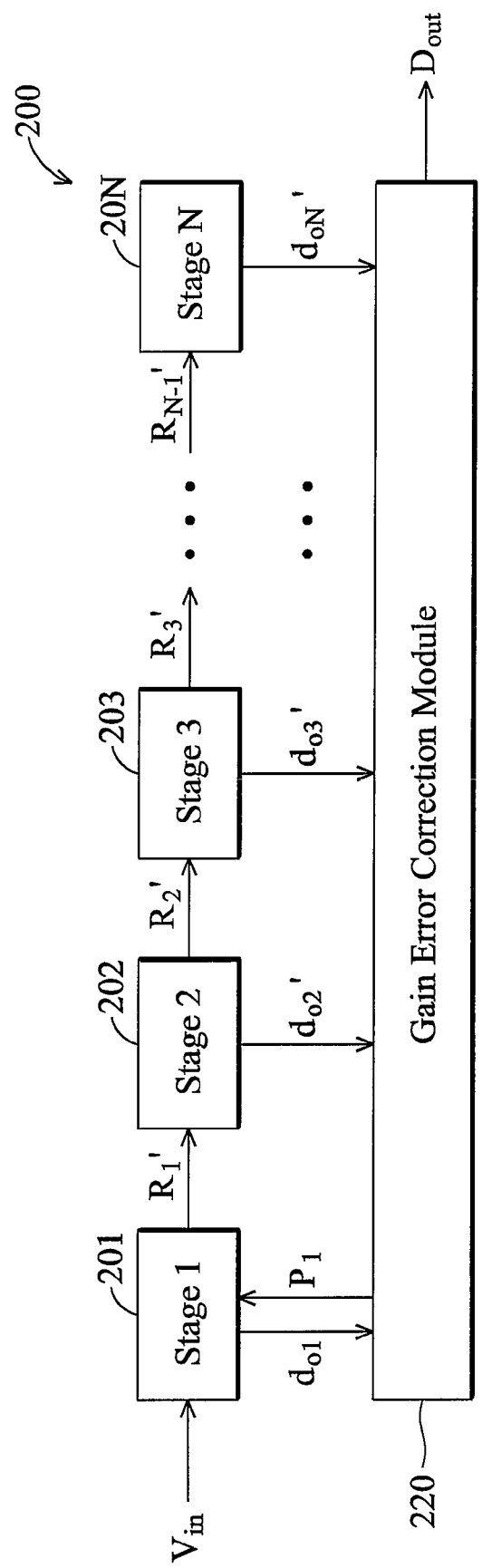
FIG. 2 shows a conventional process for estimating a gain error of a first stage of a pipelined ADC.
Figure 3:
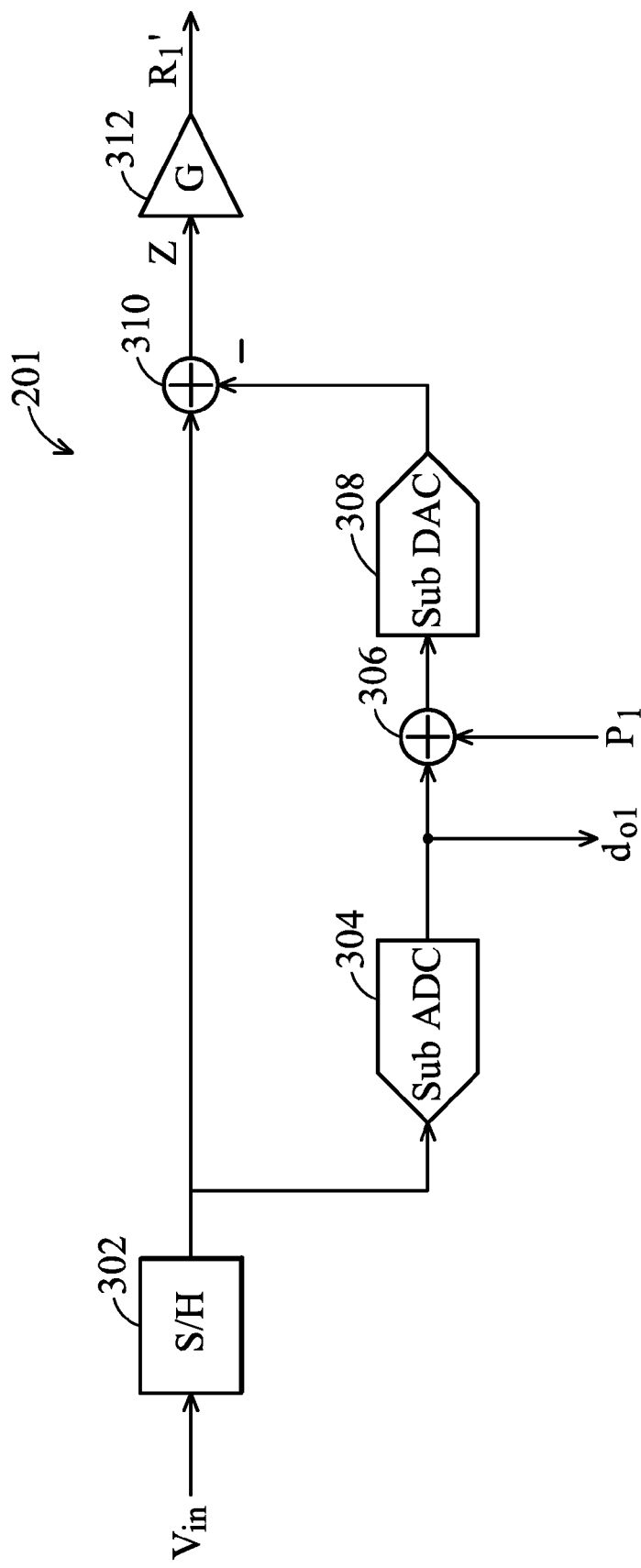
FIG. 3 is a block diagram of the first stage of the pipelined ADC of FIG. 2.
Figure 4:
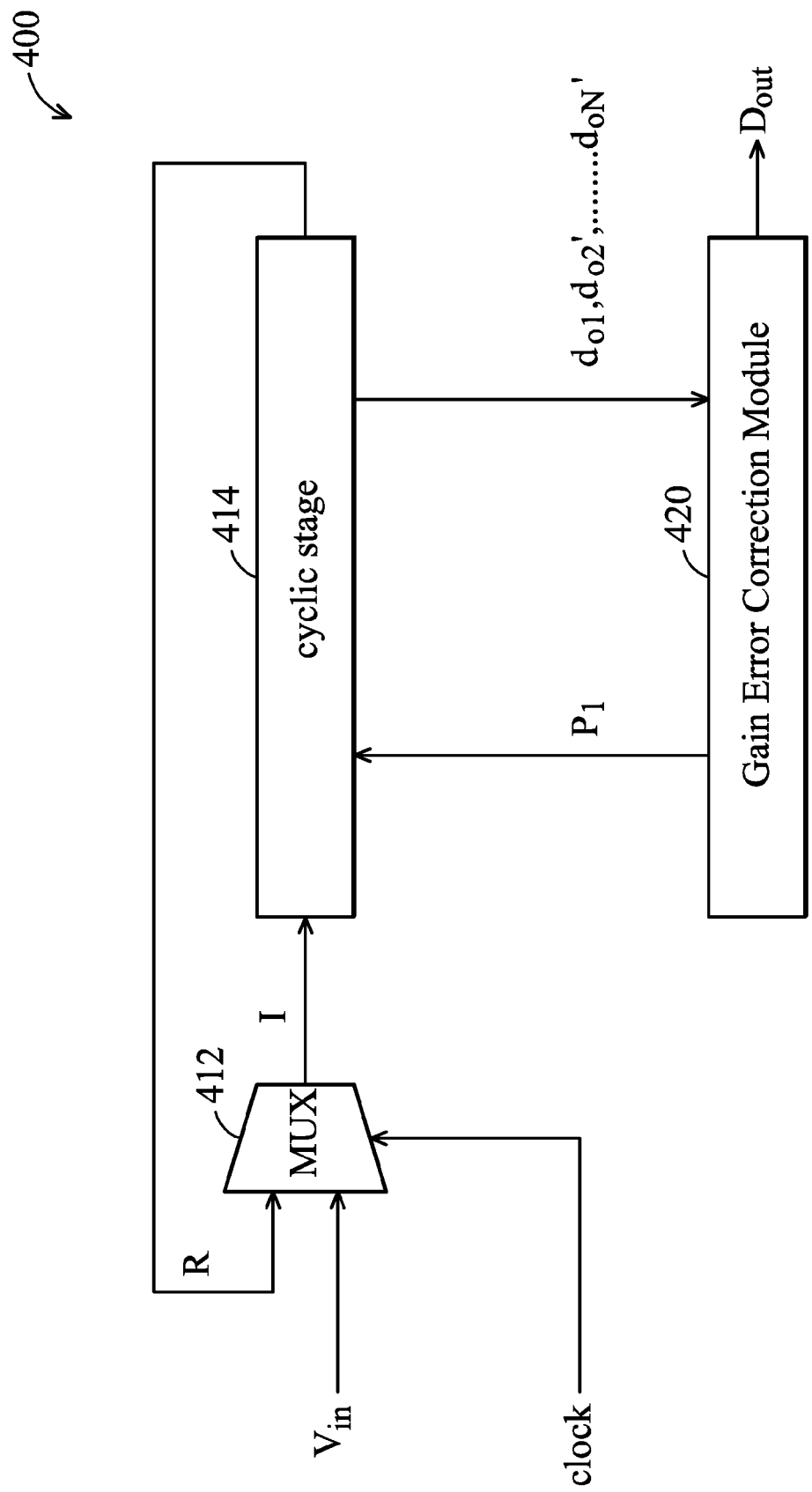
FIG. 4 shows a conventional process for estimating a gain error of a cyclic stage of a cyclic ADC.
Figure 7:
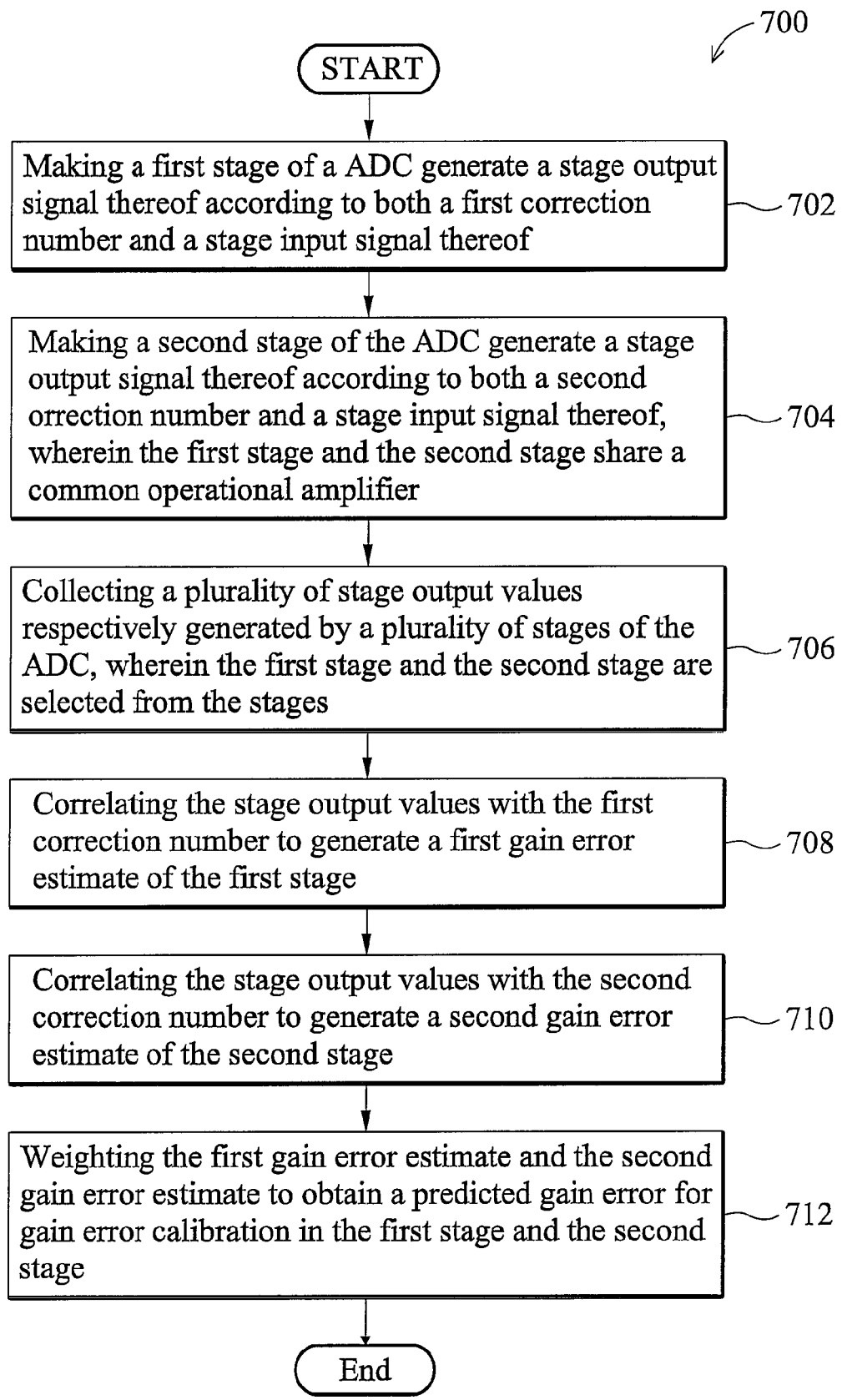
FIG. 7 is a flowchart of a method of gain error calibration in the pipelined ADC of FIG. 5 according to the invention.

FIG. 7 is a flowchart of a method of gain error calibration in the pipelined ADC 500 of FIG. 5 according to the invention. The gain error correction module 520 executes steps 702~712 to generate the predicted gain error $\epsilon_A$ for gain error calibration in the first stage 501 and the second stage 502. To calculate the gain error estimates $\epsilon_1$ and $\epsilon_2$ deviating from a predetermined gain value, the gain error correction module 520 generates two correction numbers $P_1$ and $P_2$. The gain error correction module 520 then delivers the correction number $P_1$ and $P_2$ to the first stage 501 and the second stage 502. The first stage 501 and the second stage 502 then respectively process the residual signals therein with the correction numbers $P_1$ and $P_2$ as the residual signal Z shown in FIG. 3, and then amplify the residual signals processed with correction numbers to generate the stage output signals $R_1''$ and $R_2''$. Thus, the first stage 501 generates the stage output signals $R_1'$ according to the first correction number $P_1$ and a stage input signal $V_{in}$ (step 702), and the second stage 502 generates the stage output signals $R_2''$ according to the second correction number $P_2$ and a stage input signal $R_1'$ (step 704).

The stage output values $d_{o2}'$, $d_{o3}''$, ..., $d_{oN}''$ of all of the subsequent stages 502, 503, ..., 50N of the first stage 501 are therefore changed with both the correction number $P_1$ and the gain error estimate $\epsilon_1$ of the first stage 501. The gain error correction module 520 therefore collects the stage output values $d_{o2}'$, $d_{o3}''$, ..., $d_{oN}''$ of all of the subsequent stages 502, 503, ..., 50N (step 706), and correlates the correction number $P_1$ and the stage output values $d_{o2}'$, $d_{o3}''$, ..., $d_{oN}''$ to calculate the gain error estimate $\epsilon_1$ of the first stage 501 (step 708). Accordingly, the stage output values $d_{o3}''$, $d_{o4}''$, ..., $d_{oN}''$ of all of the subsequent stages 503, 504, ..., 50N of the second stage 502 are therefore changed with both the correction number $P_2$ and the gain error estimate $\epsilon_2$ of the second stage 502, and the gain error correction module 520 can correlate the correction number $P_2$ and the stage output values $d_{o3}''$, $d_{o4}''$, ..., $d_{oN}''$ to calculate the gain error estimate $\epsilon_2$ of the second stage 502 (step 710).

Because the first stage 501 and the second stage 502 share the common operational amplifier, the actual gain values of the first stage 501 and the second stage 502 are the same, and gain errors of the first stage 501 and the second stage 502 are the same. Thus, after the gain error estimates $\epsilon_1$ and $\epsilon_2$ are obtained, the gain error calibration module 520 weights the gain error estimates $\epsilon_1$ and $\epsilon_2$ to generate a predicted gain error $\epsilon_A$ for gain error calibration in the first stage 501 and the second stage 502 (step 712). The predicted gain error is obtained according to the following algorithm:

$$\epsilon_A = \alpha_1 \times \epsilon_1 + \alpha_2 \times \epsilon_2;$$

wherein $\epsilon_A$ is the predicted gain error, $\epsilon_1$ is the first gain error estimate, $\epsilon_2$ is the second gain error estimate, $\alpha_1$ and $\alpha_2$ are predetermined parameters, and $\alpha_1 + \alpha_2 = 1$. In one embodiment, both the predetermined parameters $\alpha_1$ and $\alpha_2$ are equal to the value of 0.5.

When the conventional gain error correction module 220 estimates the gain error of the stages 201 and 202, the gain error correction module 220 must collect a great number of samples of the stage output values $d_{o2}'$, $d_{o3}'$, ..., $d_{oN}'$ to correlate with a great number of samples of the correction number $P_1$. Increase in the number of samples improves precision of the obtained gain error estimate, but increase in the number of samples also delays the generation of the gain error estimate. Thus, the conventional gain error correction module 220 cannot simultaneously improve precision of the gain error estimate and reduce latency.

The gain error correction module 520 provided by the invention, however, may simultaneously generates two gain error estimates $\epsilon_1$ and $\epsilon_2$ according to the same number of samples as the conventional gain error correction module 220. After the two gain error estimates $\epsilon_1$ and $\epsilon_2$ are weighted to obtain the predicted gain error $\epsilon_A$, the precision of the predicted gain error $\epsilon_A$ is higher than that of the gain error estimate obtained by the conventional gain error correction module 220. Thus, the gain error correction module 520 provided by the invention improves precision of the gain error estimate without a price of extra latency. Alternatively, compared to the conventional gain error correction module 220, the gain error correction module 520 provided by the invention can reduce required time for generating the gain error estimate by half without reducing the precision of the gain error estimate.

Figure 6:
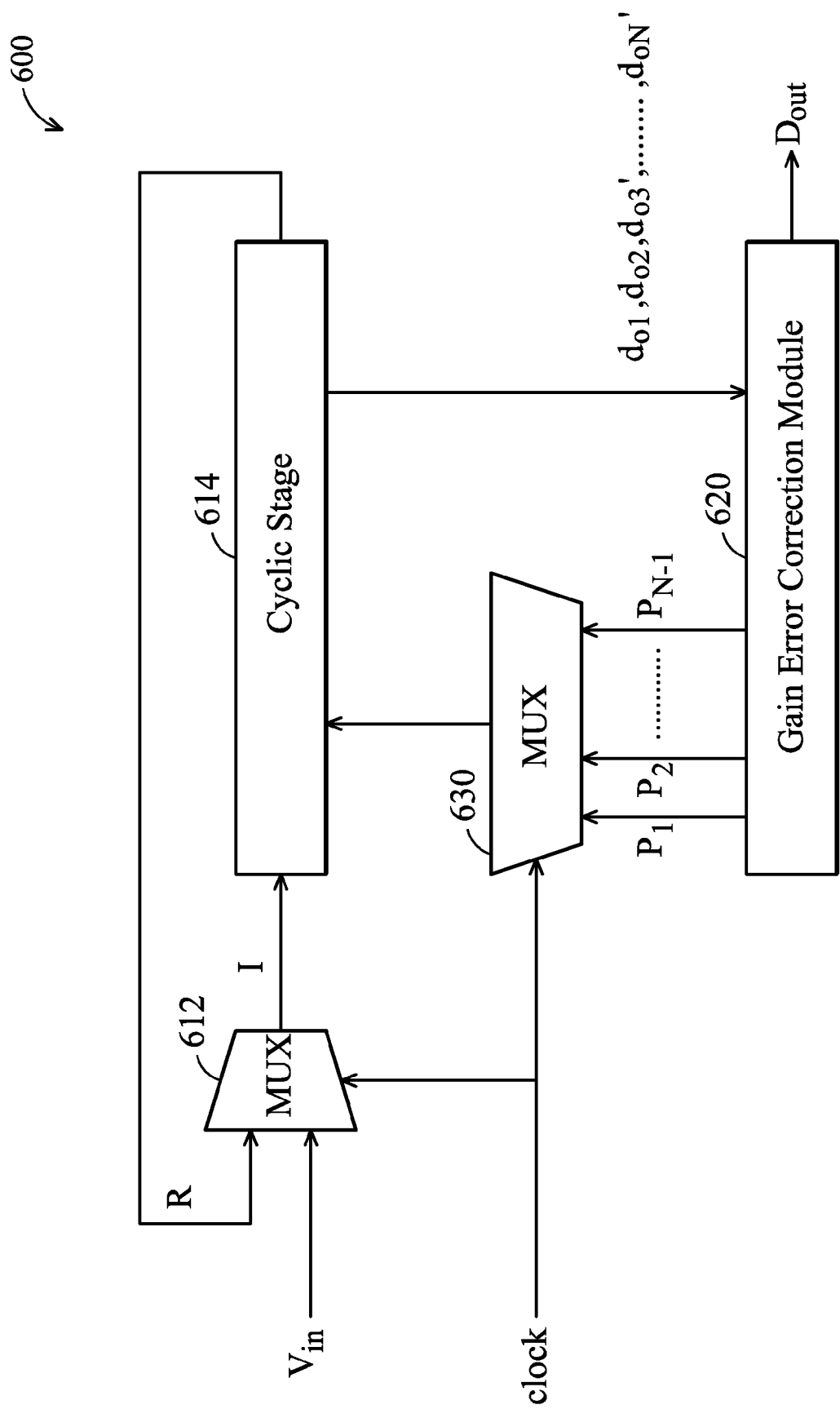
FIG. 6 shows a process for estimating a gain error of a cyclic stage of a cyclic ADC according to the invention.

FIG. 6 shows a process for estimating a gain error of a cyclic stage 614 of a cyclic ADC 600 according to the invention. Although N stages of the cyclic ADC 600 share a common physical circuit, the cyclic stage 614, the gain error correction module 620 calculates only one gain error estimate of the cyclic stage 614. The gain error correction module 620 simultaneously calculates (N−1) gain error estimates of the first (N−1) stages of the cyclic ADC 600. The gain error correction module 620 first generates (N−1) correction numbers $P_1$~$P_{N-1}$. Because the N stages of the cyclic ADC 600 share the cyclic stage 614 according to the clock signal in a time division multiplexing way, a multiplexer 630 delivers one of the correction numbers $P_1$~$P_{N-1}$ to the cyclic stage 614 according to the clock signal when one of the first (N−1) stages uses the cyclic stage. After the cyclic stage 614 sequentially generates stage output values $d_{o2}$, $d_{o3}'$, ..., $d_{oN}'$ corresponding to the (N−1) stages, the gain error correction module 620 then respectively correlates the correction number $P_1$~$P_{N-1}$ with the stage output values $d_{o2}$, $d_{o3}'$, ..., $d_{oN}'$ to obtain (N−1) gain error estimates $\epsilon_1, \epsilon_2, ..., \epsilon_{N-1}$ of the first (N−1) stages of the cyclic ADC 600.

Because the N stages of the cyclic ADC 600 share the common physical circuit of the cyclic stage 614, the actual gain values of the N stages are the same, and gain errors of the N stages are the same. The gain error correction module 620 then weights the (N−1) gain error estimates $\epsilon_1, \epsilon_2, ..., \epsilon_{N-1}$ to obtain a predicted gain error $\epsilon_A$ for gain error calibration in the N stages of the cyclic ADC 600. The predicted gain error is obtained according to the following algorithm:

$$\epsilon_A = \alpha_1 \times \epsilon_1 + \alpha_2 \times \epsilon_2 + ... + \alpha_{N-1} \times \epsilon_{N-1};$$

wherein N is the number of the stages of the cyclic ADC, $\epsilon_A$ is the predicted gain error, $\epsilon_1, \epsilon_2, ..., \epsilon_{N-1}$ are the gain error estimates of the stages except for a last stage in the series, $\alpha_1, \alpha_2, ..., \alpha_{N-1}$ are predetermined parameters, and $\alpha_1 + \alpha_2 + ... + \alpha_{N-1} = 1$. In one embodiment, all of the predetermined parameters $\alpha_1, \alpha_2, ..., \alpha_{N-1}$ are equal to the value of $1/(N-1)$.

Because the (N−1) gain error estimates $\epsilon_1, \epsilon_2, ..., \epsilon_{N-1}$ are weighted to obtain the predicted gain error $\epsilon_A$, the precision of the predicted gain error $\epsilon_A$ is higher than that of the gain error estimate obtained by the conventional gain error correction module 420. Thus, the gain error correction module 620 provided by the invention improves precision of the gain error estimate without paying a price of extra latency.

Because the final digital output value $D_{out}$ of an ADC is calculated according to both stage output values and a gain error estimate, a gain error estimate with higher precision increases precision of the final digital output value $D_{out}$. The precision of a final digital output value $D_{out}$ of an ADC can be evaluated with effective number of bits (ENOB). Because the gain error estimated by the gain error correction modules 520 has higher precision, the digital output signal $D_{out}$ generated according to the gain error is more accurate. Thus, the digital output signal $D_{out}$ generated by the pipelined ADC 500 according to the invention has a higher ENOB than that of the digital output signal $D_{out}$ generated by the conventional ADC 200. In addition, although only the gain errors of the first stage 501 and the second stage 502 are calibrated in the embodiment of FIG. 5, the method 700 of gain error calibration is applicable to all the stages 501~50N of the analog-to-digital converter 500.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of gain error calibration in a pipelined analog-to-digital converter (ADC), wherein the pipelined ADC comprises a plurality of stages connected in series, each of the stages generates a stage output signal as a stage input signal of a subsequent stage of the series, a first stage and a second stage selected from the stages generate the stage output signals thereof with a common operational amplifier, the method comprising:
   making the first stage generate the stage output signal thereof according to both a first correction number and the stage input signal thereof;
   making the second stage generate the stage output signal thereof according to both a second correction number and the stage input signal thereof;
   collecting a plurality of stage output values respectively generated by the stages;
   correlating the stage output values with the first correction number to estimate a first gain error estimate of the first stage;
   correlating the stage output values with the second correction number to estimate a second gain error estimate of the second stage; and
   weighting the first gain error estimate and the second gain error estimate to obtain a predicted gain error for gain error calibration in the first stage and the second stage.

2. The method as claimed in claim 1, wherein the predicted gain error is obtained according to the following algorithm:

$$\epsilon_A = \alpha_1 \times \epsilon_1 + \alpha_2 \times \epsilon_2;$$

wherein $\epsilon_A$ is the predicted gain error, $\epsilon_1$ is the first gain error estimate, $\epsilon_2$ is the second gain error estimate, $\alpha_1$ and $\alpha_2$ are predetermined parameters, and $\alpha_1 + \alpha_2 = 1$.

3. The method as claimed in claim 2, wherein both the predetermined parameters $\alpha_1$ and $\alpha_2$ are equal to the value of 0.5.

4. The method as claimed in claim 1, wherein the stages periodically derive the stage output values thereof from the stage input signals thereof.

5. The method as claimed in claim 4, wherein the pipelined ADC converts an analog input signal to a digital output signal, the analog input signal is the stage input signal of a beginning stage of the stages, and the stage output values collectively form the digital output signal.

6. A pipelined analog-to-digital converter (ADC), comprising:
   a plurality of stages, connected in series, each generating a stage output signal as a stage input signal of a subsequent stage of the series and deriving a stage output value from the stage input signal thereof, wherein a first stage and a second stage selected from the stages generates the stage output signals thereof with a common operational amplifier; and
   a gain error correction module, generating a first correction number to affect generation of the stage output signal of the first stage, generating a second correction number to affect generation of the stage output signal of the second stage, collecting the stage output values generated by the stages, correlating the stage output values with the first correction number to estimate a first gain error estimate of the first stage, correlating the stage output values with the second correction number to estimate a second gain error estimate of the second stage, and weighting the first gain error estimate and the second gain error estimate to obtain a predicted gain error for gain error calibration in the first stage and the second stage.

7. The pipelined ADC as claimed in claim 6, wherein the gain error correction module obtains the predicted gain error according to the following algorithm:

$$\epsilon_A = \alpha_1 \times \epsilon_1 + \alpha_2 \times \epsilon_2;$$

wherein $\epsilon_A$ is the predicted gain error, $\epsilon_1$ is the first gain error estimate, $\epsilon_2$ is the second gain error estimate, $\alpha_1$ and $\alpha_2$ are predetermined parameters, and $\alpha_1 + \alpha_2 = 1$.

8. The pipelined ADC as claimed in claim 7, wherein both the predetermined parameters $\alpha_1$ and $\alpha_2$ are equal to the value of 0.5.

9. The pipelined ADC as claimed in claim 6, wherein the pipelined ADC converts an analog input signal to a digital output signal, the analog input signal is the stage input signal of a beginning stage of the stages, and the stage output values collectively form the digital output signal.

10. A method of gain error calibration in a cyclic analog-to-digital converter (ADC), wherein the cyclic ADC comprises a plurality of stages connected in series, each of the stages derives a stage output value thereof from a stage input signal thereof and generates a stage output signal thereof as a stage input signal of a subsequent stage in the series, and the stages share a common physical circuit in a time division multiplexing way, the method comprising:
   generating a plurality of correction numbers;
   making the stages generate the stage output signals thereof according to both, one of the correction numbers and the stage input signals thereof;
   collecting the stage output values generated by the stages;
   correlating the stage output values with the correction numbers to calculate a plurality of gain error estimates of the stages; and
   weighting the gain error estimates to obtain a predicted gain error for gain error calibration of the stages.

11. The method as claimed in claim 10, wherein the predicted gain error is obtained according to the following algorithm:

$$\epsilon_A = \alpha_1 \times \epsilon_1 + \alpha_2 \times \epsilon_2 + \ldots + \alpha_{N-1} \times \epsilon_{N-1};$$

wherein N is the number of the stages of the cyclic ADC, $\epsilon_A$ is the predicted gain error, $\epsilon_1, \epsilon_2, \ldots, \epsilon_{N-1}$ are the gain error estimates of the stages except for a last stage in the series, $\alpha_1, \alpha_2, \ldots, \alpha_{N-1}$ are predetermined parameters, and $\alpha_1 + \alpha_2 + \ldots + \alpha_{N-1} = 1$.

12. The method as claimed in claim 11, wherein the predetermined parameters $\alpha_1, \alpha_2, \ldots, \alpha_{N-1}$ are all equal to the value of $1/(N-1)$.

13. The method as claimed in claim 10, wherein the cyclic ADC converts an analog input signal to a digital output signal, the analog input signal is the stage input signal of a beginning stage of the stages, and the stage output values collectively form the digital output signal.

* * * * *